(12) United States Patent
Lyke

(10) Patent No.: US 6,331,788 B1
(45) Date of Patent: Dec. 18, 2001

(54) SIMPLIFIED CELLULAR ARRAY STRUCTURE FOR PROGRAMMABLE BOOLEAN NETWORKS

(75) Inventor: James C. Lyke, Albuquerque, NM (US)

(73) Assignee: The United States of America as represented by the Secretary of the Air Force, Washington, DC (US)

(*) Notice: Subject to any disclaimer, the term of this patent is extended or adjusted under 35 U.S.C. 154(b) by 0 days.

(21) Appl. No.: 09/681,980

(22) Filed: Jul. 3, 2001

(51) Int. Cl.[7] .................................................. H03K 19/177
(52) U.S. Cl. .................................................. 326/39; 326/41
(58) Field of Search ........................................... 326/37–41

(56) References Cited

U.S. PATENT DOCUMENTS

| | | | |
|---|---|---|---|
| 6,069,490 | * | 5/2000 | Ochotta et al. .......................... 326/41 |
| 6,114,873 | * | 9/2000 | Sahraoui et al. ........................ 326/39 |
| 6,122,720 | * | 9/2000 | Cliff ....................................... 712/15 |
| 6,215,327 | * | 4/2001 | Lyke ....................................... 326/41 |

OTHER PUBLICATIONS

Christopher Moore and Arthur A. Drisko, "Algebraic Properties of the Block Transformation of Cellular Automata", Complex Systems, vol. 10, No. 3, 1996, 185–194.

* cited by examiner

*Primary Examiner*—Michael Tokar
*Assistant Examiner*—Don Phu Le
(74) *Attorney, Agent, or Firm*—Kenneth E. Callahan

(57) ABSTRACT

PRS07010 A simplified implementation of molecular field programmable gate arrays described in U.S. Pat. No. 6,215,327, reducing the complexity of a single site in a tiled array template to that of a 2-input lookup table.

2 Claims, 11 Drawing Sheets

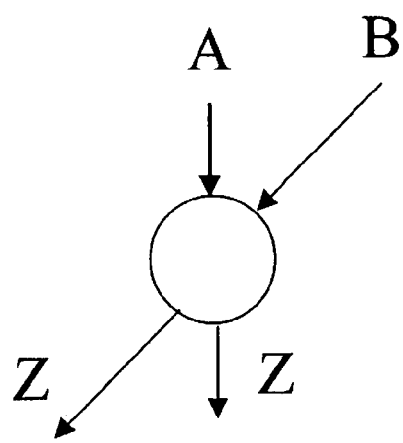
FIG. 4a
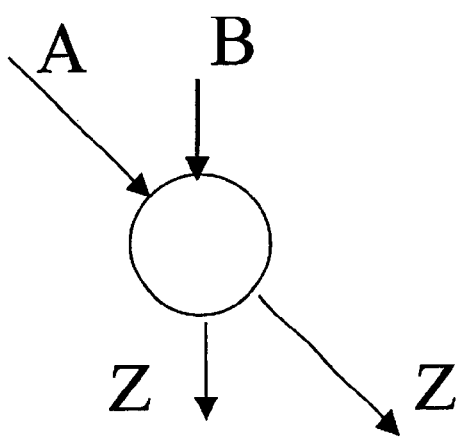
FIG. 4b
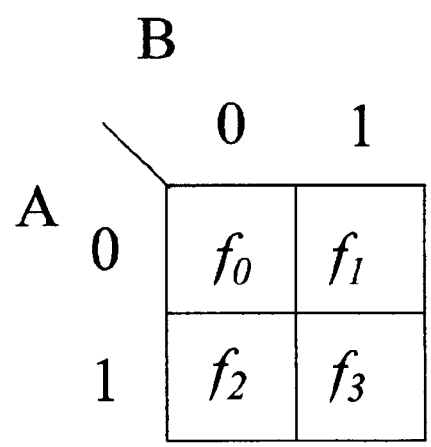
FIG. 4c
| A | B | Z |
|---|---|---|
| 0 | 0 | $f_0$ |
| 0 | 1 | $f_1$ |
| 1 | 0 | $f_2$ |
| 1 | 1 | $f_3$ |
FIG. 4d

| $f_3$ | $f_2$ | $f_1$ | $f_0$ | function | | $f_3$ | $f_2$ | $f_1$ | $f_0$ | function |
|---|---|---|---|---|---|---|---|---|---|---|
| 0 | 0 | 0 | 0 | ZERO | | 1 | 0 | 0 | 0 | A AND B |
| 0 | 0 | 0 | 1 | $\overline{A}$ AND $\overline{B}$ | | 1 | 0 | 0 | 1 | $\overline{(A\ XOR\ B)}$ |
| 0 | 0 | 1 | 0 | $\overline{A}$ AND B | | 1 | 0 | 1 | 0 | B |
| 0 | 0 | 1 | 1 | $\overline{A}$ | | 1 | 0 | 1 | 1 | $\overline{A}$ OR B |
| 0 | 1 | 0 | 0 | A AND $\overline{B}$ | | 1 | 1 | 0 | 0 | A |
| 0 | 1 | 0 | 1 | $\overline{B}$ | | 1 | 1 | 0 | 1 | A OR $\overline{B}$ |
| 0 | 1 | 1 | 0 | A XOR B | | 1 | 1 | 1 | 0 | A OR B |
| 0 | 1 | 1 | 1 | A NAND B | | 1 | 1 | 1 | 1 | ONE |

FIG. 5

SIMPLIFIED CELLULAR ARRAY STRUCTURE FOR PROGRAMMABLE BOOLEAN NETWORKS

FEDERAL RESEARCH STATEMENT

[The conditions under which this invention was made are such as to entitle the Government of the United States under paragraph l(a) of Executive Order 10096, as represented by the Secretary of the Air Force, to the entire right, title and interest therein, including foreign rights.]

BACKGROUND OF THE INVENTION

The invention relates to field programmable gate array circuits used in digital circuit design, and in particular, to a simplified architectural design for their implementation on a molecular level related to U.S. Pat. No. 6,215,327.

A detailed background for the present invention can be found in U.S. Pat. No. 6,215,327, entitled Molecular Field Programmable Gate Array, which is hereby incorporated by reference in its entirety. The key concept introduced in '327 is that by connecting together a feed-forward network of identical, elemental assemblies referred to as look-up tables or LUTs, it is possible to form a field programmable gate array (FPGA) capable of computing any spatial Boolean function so long as the array is sufficiently large. The novelty of the molecular field programmable gate array lies in its ability for complex expression by using simple building blocks with low interconnection demand (only nearest-neighbor connectivity is required) that are arranged in a completely periodic fashion.

It is believed that three requirements for molecular electronics are: (1) low interconnection demand, (2) defect tolerance, and (3) capable of manufacture through non-lithographic methods. In traditional integrated circuits built in silicon, these boundary conditions are desirable but not essential. Low interconnection demand, for example, is compensated for by having many levels of planar interconnections (i.e., increased interconnection supply). In traditional microelectronics, defect tolerance is removed as a requirement by having fabrication processes that achieve very low numbers of defects, such that the production of integrated circuits has a high enough yield to be economically tractable. Finally, the cornerstone of conventional integrated circuits is lithography, and it is inconceivable to the present industry to attempt to construct complex circuits without it. This is because, most fundamentally, it is lithography which defines deliberate and complex patterns of the diffusion zones that become transistors and the interconnection patterns that bring them together to form complex digital circuits. However, this plan does not work at molecular scales, since high-volume lithography is impossible, as we presently understand technology. Furthermore, the sheer density of molecular circuits compromises the notion of high availability of interconnections. Finally, it is envisioned that defect mechanisms will be abundant. Even if lithography and interconnection supply were not issues, the likely pervasiveness of defects would render most normal integrated circuit designs inoperative.

U.S. Pat. No. 6,215,327 identified an alternative scheme. Its fundamental requirement was the existence of a simple, programmable cell, which upon arranging a number of them into a planar or 3-D array, could yield complex behaviors. In fact, the invention was the basis of perhaps the simplest conceivable FPGA, which could be harnessed to implement very complex circuits by programming each site as required after assembly so that the ensemble produced a desired set of circuit functions.

In the '327 patent, a number of templates were defined, each of which required cells or sites with a minimum of three inputs or three outputs. Every concept of that invention applies to the present invention, except that two newer and simpler templates, specifically templates requiring only two inputs and two outputs, are now introduced.

SUMMARY OF INVENTION

In a preferred embodiment, the invention replaces the 3-input lookup tables (3LUTs) of U.S. Pat. No. 6,215,327 with 2-input lookup tables (2LUTs). Two embodiments, electrically identical, are described. A preferred embodiment is based on an alternating periodic arrangement of 2LUTs in a nearest-neighbor connective network.

Other aspects and advantages of the present invention will become apparent from the following detailed description, taken in conjunction with the accompanying drawing, illustrating by way of example the principles of the invention.

BRIEF DESCRIPTION OF DRAWINGS

FIGS. 4a and 4b show the two similar cell structures obtained by suppressing the dashed line connections of FIG. 2.

FIG. 4c is a Karnaugh map representation of a 2LUT.

FIG. 4d is a truth table representation of a 2LUT.

FIG. 5 lists all possible Boolean functions of two inputs.

DETAILED DESCRIPTION

Figure 1:
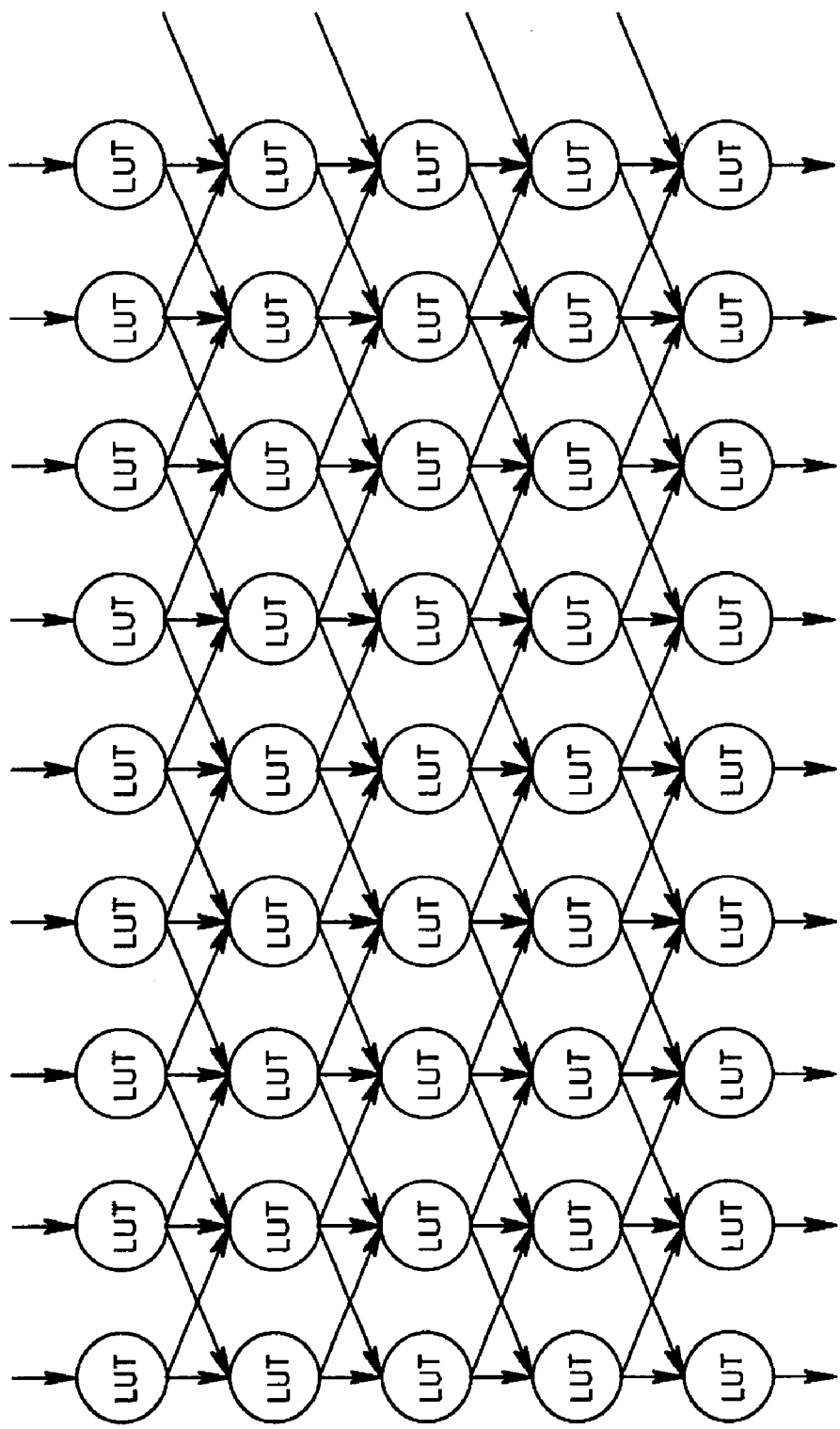
FIG. 1 illustrates the basic feedforward network of 3-input lookup tables found in the prior art.

The basic feedforward network of 3-input look-up tables (3LUTs) from the prior art (U.S. Pat. No. 6,215,327 is shown in FIG. 1. It is a periodic two-dimensional (planar) arrangement of an identical cell type. The three inputs of the cell are inputs to a 3LUT. LUTs are defined as universal functions, which can be programmed to implement any of the $2^{(2^k)}$ possible functions of k inputs, with k=3 in this case. Though each cell has three outputs as well, it is important to note that the outputs are electrically identical (i.e., they are shorted together).

Two simpler networks have now been found that can be implemented with simpler cell sites, specifically ones that contain only two inputs and two outputs. Both of these networks are equivalent.

First type of two-input network. FIG. 1 is a an array or tile based on 3-input lookup tables (FIG. 16 of U.S. Pat. No. 6,215,327) The FIG. 1 tile is a large planar (x-column, y-row) of identical cells, each cell implementing a single, universal 3-input Boolean look-up table with six non-redundant, non-power terminal connection patterns per LUT, each LUT being allowed to be distinct and individually programmable for a particular logic function or for routing from external inputs or outputs, the last row of periodic LUT tiles being terminated in a linear array of registers, and side coupling being permitted between tiles. The tile contains periodic wire input/output attachments to any side of tile or register array termini, subject to cone of influence effects.

Figure 2:
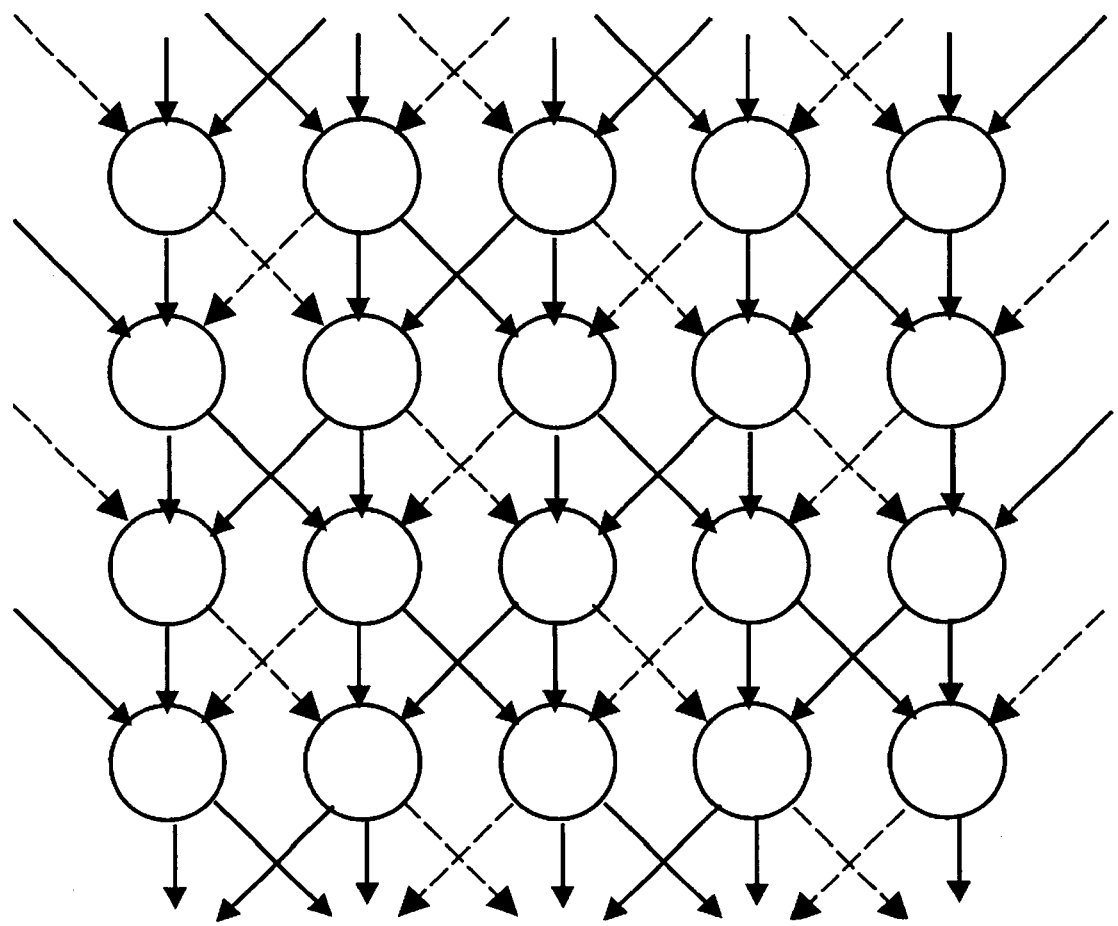
FIG. 2 shows a simpler feedforward network obtained by suppressing certain connections of the FIG. 1 network.

A simpler structure can be derived from the 3LUT by suppressing certain connections from the FIG. 1 network, as shown in FIG. 2. Removing the connections in FIG. 2 with dashed lines produces the network shown in FIG. 3. This network differs from the FIG. 1 network fundamentally in that each cell site depends only on two inputs and has only two outputs. Note that the new FIG. 3 structure was formed as a deliberate periodic network. By removing the links shown in FIG. 2, a network based on the periodic arrangement of two similar structures is created. This is shown in FIGS. 4(a) and 4(b); There is one significant difference in the cell structures shown in FIGS. 4(a) and 4(b). It is important to note that the two outputs are electrically identical for either of these fundamental cell types. No specialized routing structures for these tiles are required since logic functions can imitate wiring from any LUT input to an output, allowing the LUTs to emulate both logic and (virtual) wiring.

Each site, whether 4(a) or 4(b), contains a programmable function, such as a lookup table. In this case the programmable function is a 2LUT, which is capable of representing $2^{2^2}=16$ different functions. The lookup table can unambiguously be represented in at least one of three ways. First, a 2LUT can be represented as a Karnaugh map, as shown in FIG. 4(c). Second, a 2LUT can be represented as a truth table, as shown in FIG. 4(d). With either of these representations in mind, there is a third compact way of representing a 2LUT as a single number based on a juxtaposed representation of either map:

$$\sum_{i=0}^{3} f_i \cdot 2^i = f_0 + 2f_1 + 4f_2 + 8f_3$$

This representation always turns out to be a decimal number between 0 and 15, when any of the $f_i$ are either 0 or 1. For convenience, all possible Boolean functions of two inputs are shown in FIG. 5.

Figure 3:
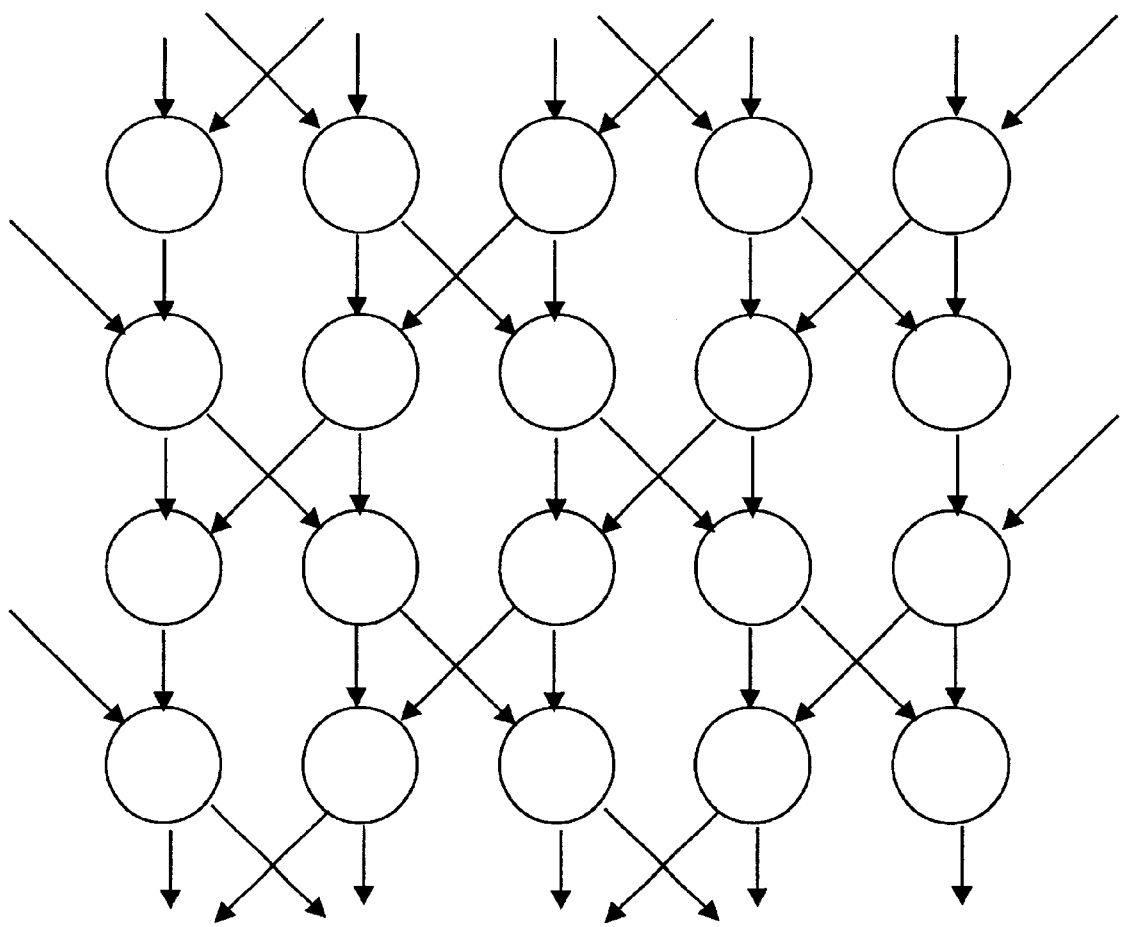
FIG. 3 shows the simpler feedforward network with the suppressed connections of FIG. 2 removed.

The FIG. 3 network does contain a number of crossovers, which is an essential requirement to implement non-planar circuits. When each site contains a single 2LUT, it can be shown that such a reconfigurable network is capable of universal expression as a circuit. This can be done by showing: (a) that interconnect patterns can be shuffled as required and (b) that a progression of lookup tables of higher complexity (e.g. 3LUTs, 4LUTs, etc.) can be directly mapped into the FIG. 3 network, if it is large enough.

Figure 6:
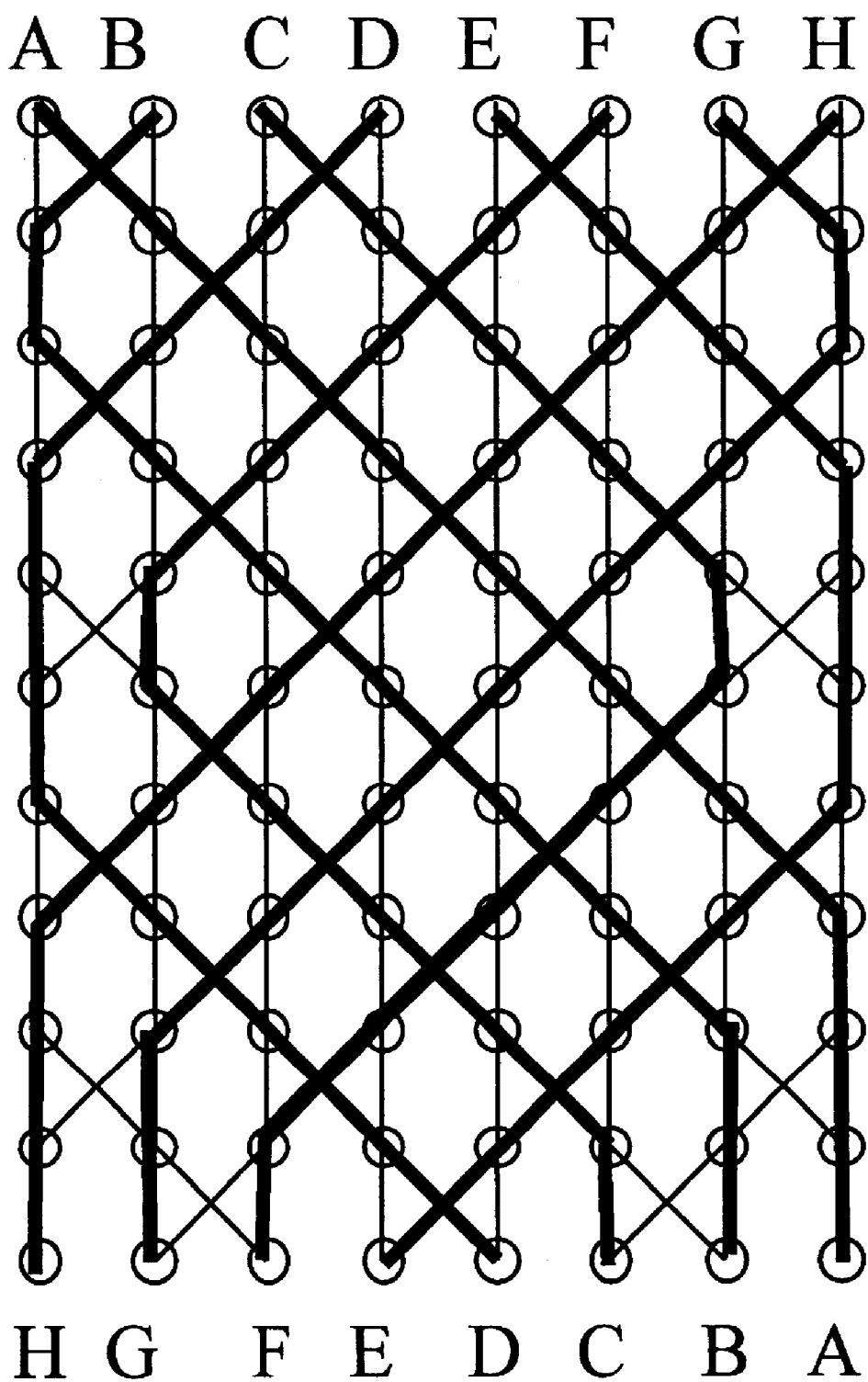
FIG. 6 illustrates the implementation of interconnect redistribution by demonstrating the complete reversal of a signal network.

To illustrate the implementation of interconnect redistribution, it is straightforward to demonstrate the complete reversal of a signal network, as shown in FIG. 6. This figure demonstrates clearly the need for crossovers in these networks, as any such redistribution would be impossible without them. This figure also demonstrates the ability to directly implement interconnect shuffling networks of arbitrary complexity.

Next is considered the case of implementing a 3LUT with 2LUTs. As is obviously the case, a 3LUT can implement any arbitrary 3-input function. With the well-known Shannon decomposition, we may write any 3-input function thus:

$$f(a,b,c)=f(a,b,0)\cdot\bar{c}+f(a,b,1)\cdot c=f_1(a,b)\cdot\bar{c}+f_2(a,b)\cdot c$$

where "+" is logical OR, "." is logical AND, and $f_1$, $f_2$ are arbitrary and independent two-input functions of a,b. Hence, it is possible to decompose a 3LUT into a form that can be expressed with 2LUTs. By induction, an nLUT (n>3) can be decomposed through Shannon's decomposition. Hence, if a 3LUT can be represented in an architecture containing only 2LUTs, then it is possible to eventually implement an arbitrarily large nLUT, assuming that the FIG. 3 array (tile) has enough rows and columns. Since an nLUT implements any n-input Boolean function, then showing a 3LUT "embedded" in a 2LUT fabric illustrates the feasibility of scaling the computational capacity of this proposed invention.

Figure 7:
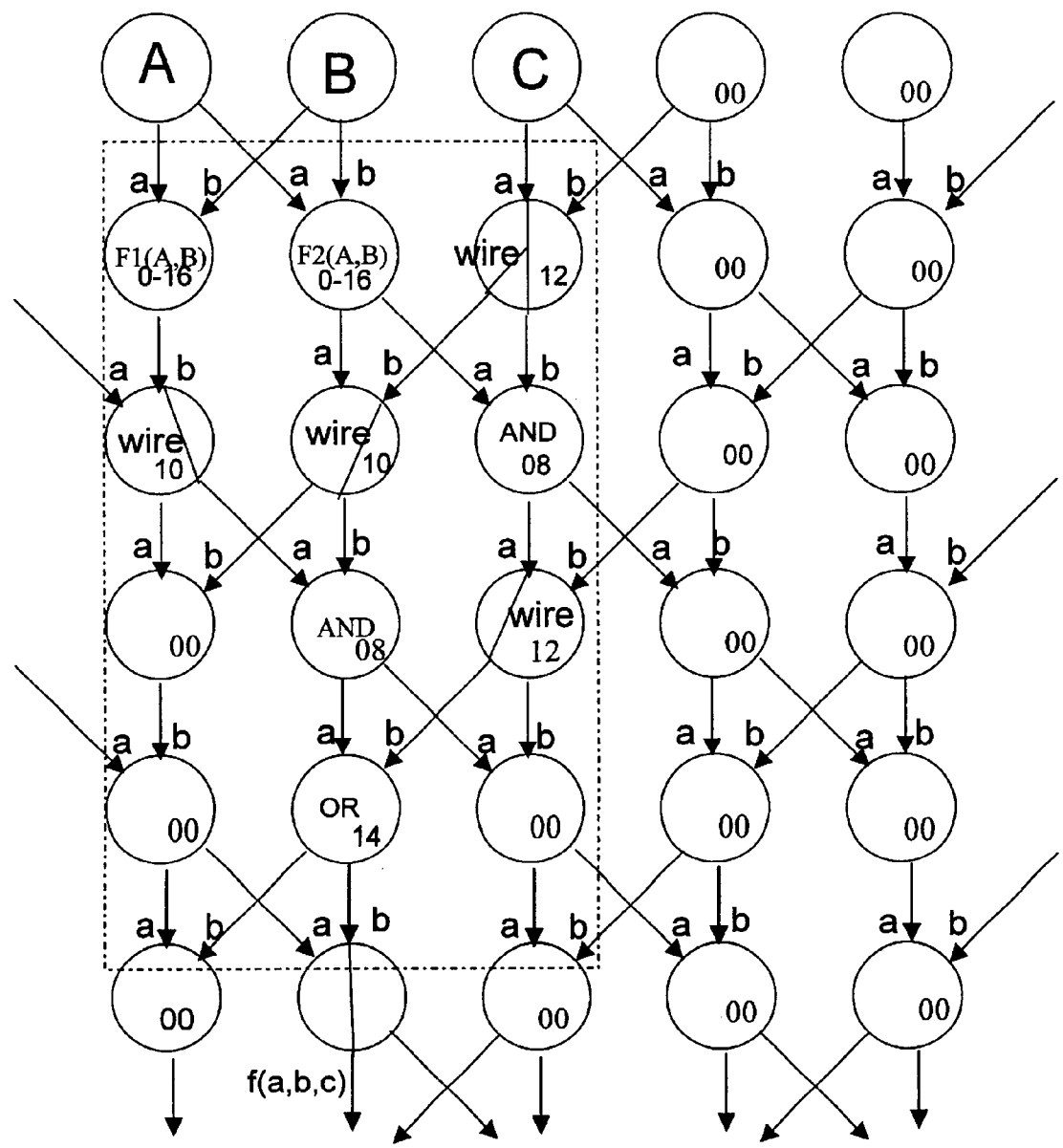
FIG. 7 illustrates the possible implementation of a 3LUT using 2LUTs.

One possible implementation of a 3LUT based on a composition from 2LUTs is shown in FIG. 7. In this figure, the equivalent functionality of a 3LUT is contained within the dashed rectangle. Within each circle (2LUT) is defined as one of the possible 2-input functions (from FIG. 5). These functions implement specified behaviors that will result in a 3LUT equivalent function. Within these circles, codes and symbolic labels are written to represent specific choices drawn from the "pool of functions" in FIG. 5. When the function is known, it is represented by a specific code from 0–16, along with an equivalent, symbolic description (such as AND). Not all 2LUTs are required to implement the function. Unused 2LUTs are given (arbitrarily) the code "0" (the zero function of FIG. 5).

Figure 8:
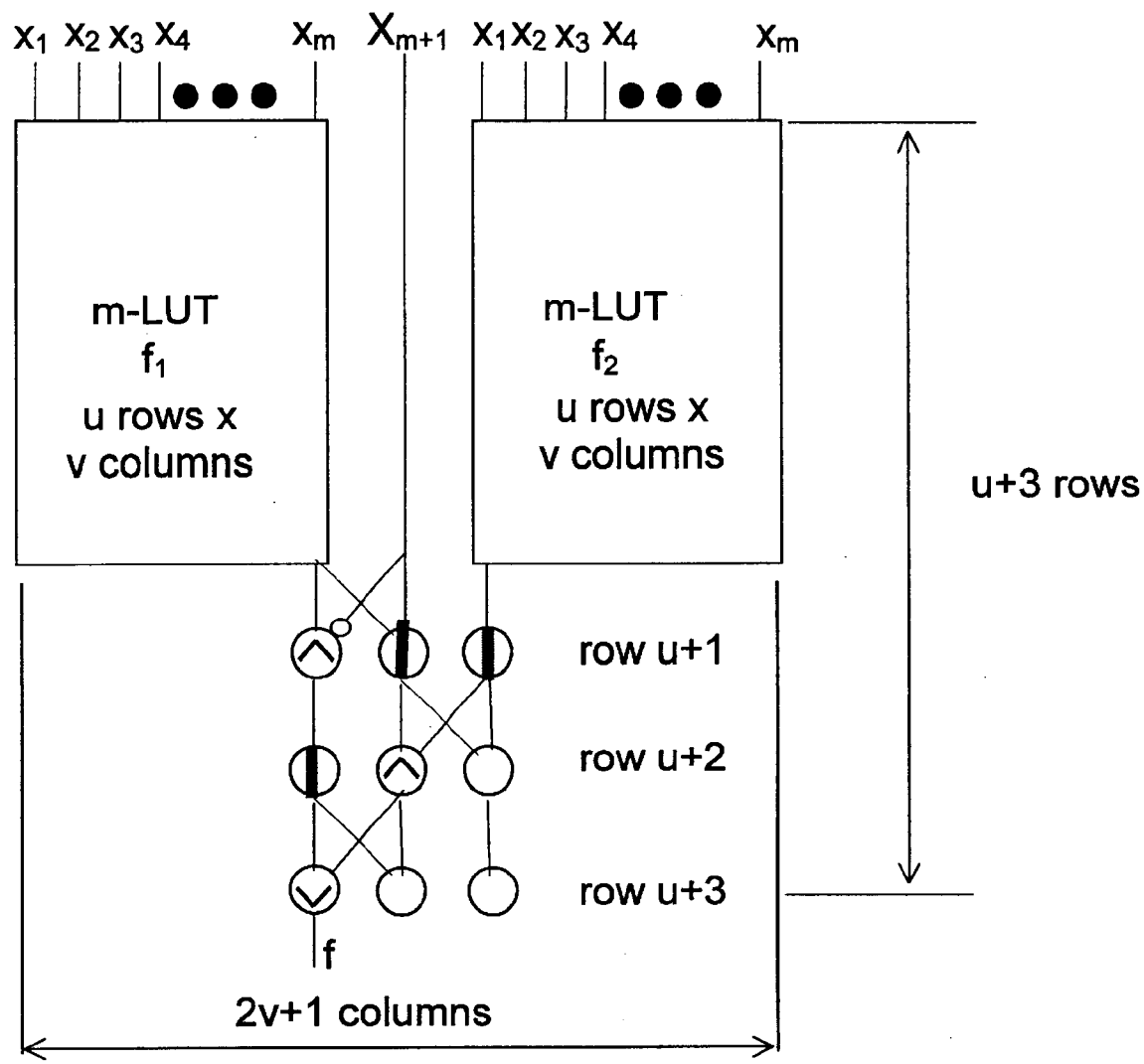
FIG. 8 symbolically demonstrates by induction that an (m+1)LUT can be constructed from an mLUT.

Hence, it is possible to implement higher complexity LUTs from elemental LUTs in the framework of the present invention. This proof will be accomplished inductively. To demonstrate the inductive extension of 2LUTs to an arbitrarily complex LUT, it is necessary first to demonstrate the basic case (3LUT, the first extension of a 2LUT) and then demonstrate the feasibility of induction by showing that an (m+1)LUT can be constructed from an mLUT. The results of the basic 3LUT case have already been shown in FIG. 7. The inductive extension step is outlined in FIG. 8. Once again, Shannon's decomposition required to specify a (m+1)LUT in terms of two mLUTs:

$$f(x_1, x_2, \ldots x_{m+1})=f(x_1, x_2, \ldots x_m, 0)\cdot\bar{x}_{m+1}+f(x_1, x_2, \ldots x_m, 1)\cdot x_{+1}= f_1(x_1,x_2, \ldots x_m)\cdot\bar{x}_{m+1}+f_2(x_1,x_2, \ldots x_m,1)\cdot x_{m+1}$$

The two, mLUTs are represent by tiled arrangements of the FIG. 3 form. Assuming the size of each mLUT is u×v, the addition of the (m+1)st variable requires an additional column and the formation of the (m+1)LUT requires three additional rows, completing the construction and the inductive proof.

Figure 9:
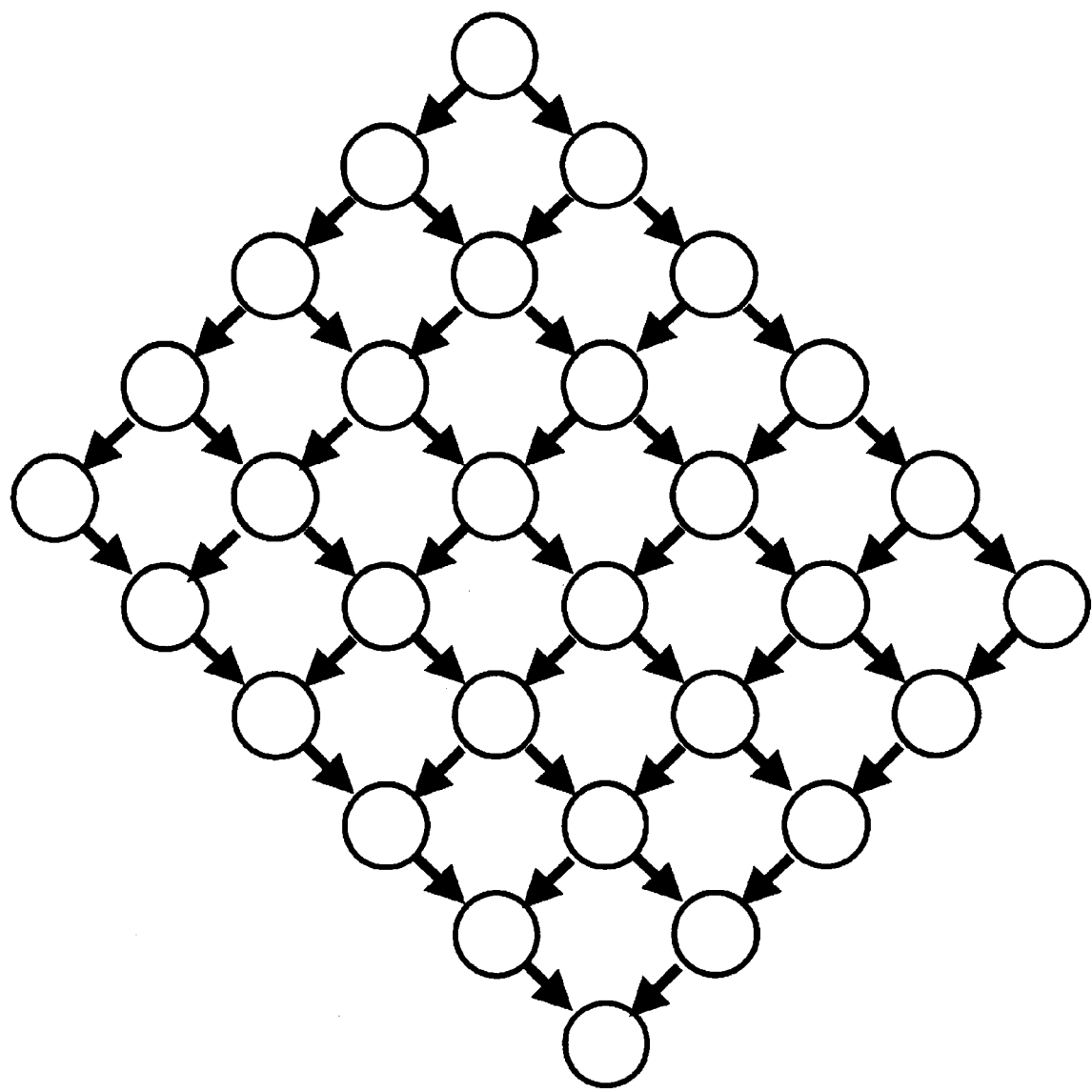
FIG. 9 illustrates a second two-input network type based on cellular automata theory.
Figure 10A:
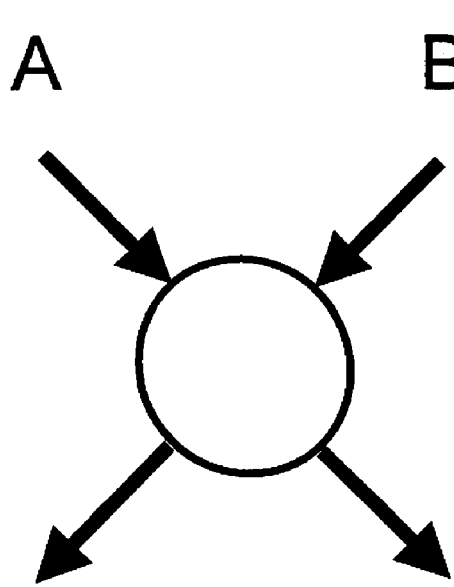
FIG. 10a is a two-input, two-output cell of the second type.
Figure 10B:
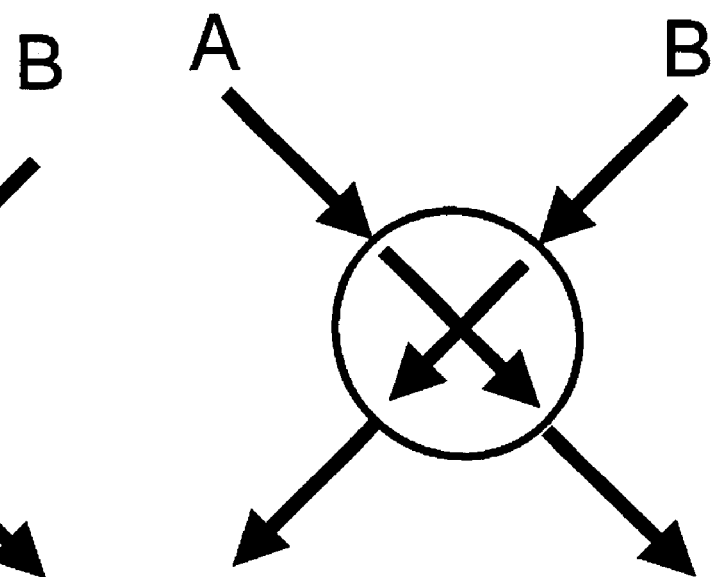
FIG. 10b shows a crossover implementation of the distinct electrical outputs.
Figure 10C:
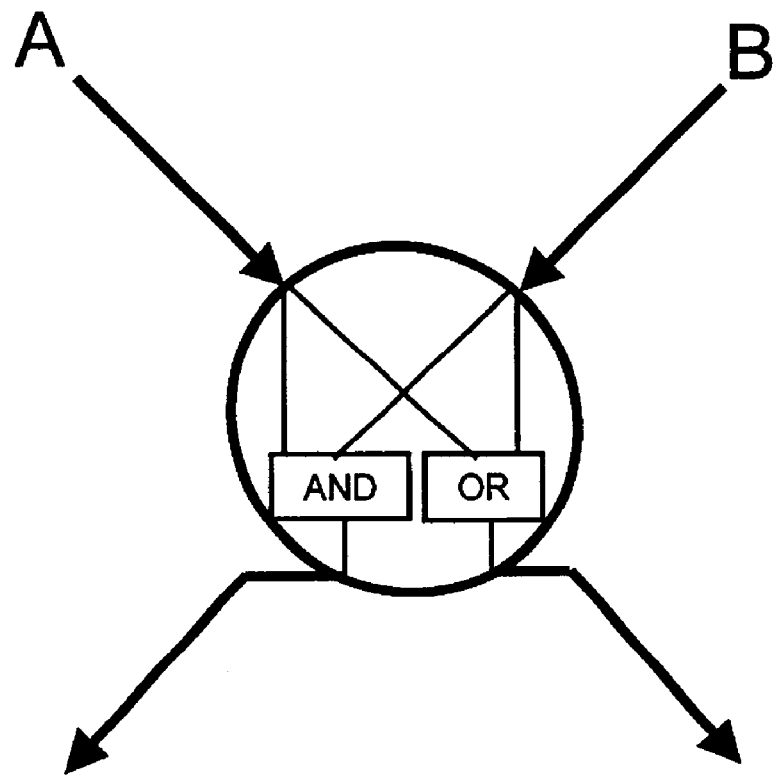
FIG. 10c shows two independent look-up tables (LUTs) employed in a cell, implementing the left and right outputs as two distinct, independently defined functions of the same two inputs.

Second type of two-input network. The second two-input network type is shown in FIG. 9. In cellular automata (CA) theory, this structure has sometimes been called a "half-neighborhood" CA (Christopher Moore and Arthur A. Drisko, "Algebraic Properties of the Block Transformation of Cellular Automata", Complex Systems, volume 10, number 3,1996, 185–194). In this case, the cell at each site is identical and has identical connection geometry, whereas the FIG. 3 network requires identical cells, but with two different connection geometries. Unlike the FIG. 3 network, however, it is necessary to employ outputs that are electrically distinct. In other words, it is necessary to use two independent 2LUTs within each cell to achieve the same level of "universality". This provision is necessary due to the lack of crossovers within an otherwise inherently planar feedforward network. The cell, depicted in FIG. 10(a), has two inputs and two outputs. So, by virtue of the planar FIG. 9 network having two independent LUTs contained in the same cell boundary, it is possible to simulate crossovers. The electrical outputs are distinct, and a crossover is implement as shown in FIG. 10(b) by defining the left output to be function "B" ("1010" in FIG. 5, or simply number 10) and defining the right output to be function "A" ("1100" in FIG. 5 or number 12). In fact, if two independent look-up tables (LUTs) are employed in each cell, it is possible to implement the left and right outputs as two distinct, independently defined functions of the same two inputs, as shown in FIG. 10(c). This example shows the definition of the left output function as AND (number 8) and the right output function as OR (number 14), referring to the FIG. 5 table.

Figure 11B:
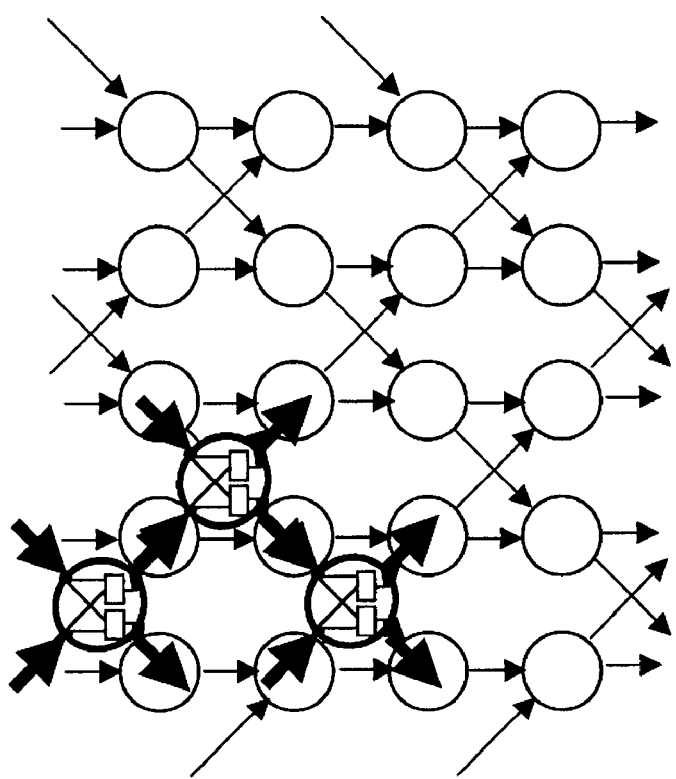
FIGS. 11A and 11B show the equivalence of the FIG. 9 network type with the repeated crossover structures in FIG. 3
Figure 11A:
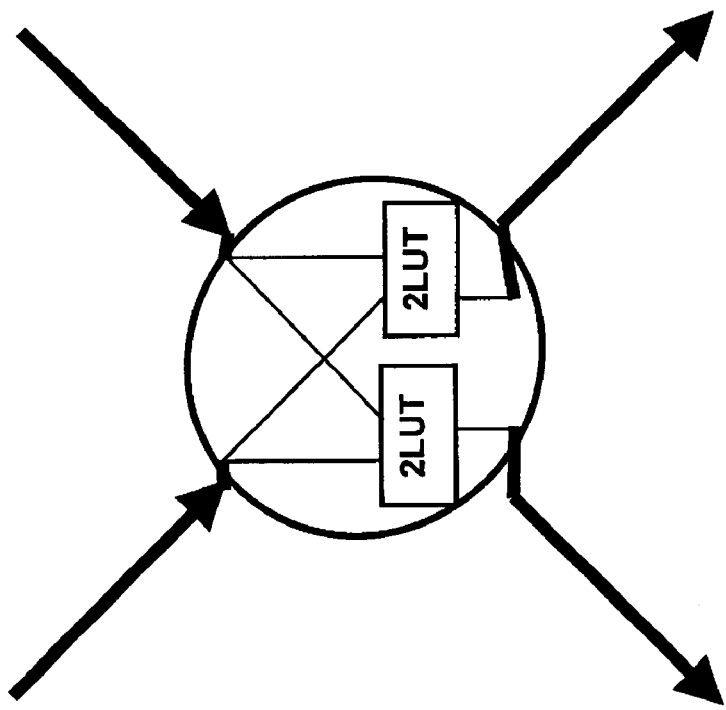

Upon further reflection of the symmetry and the fact that two independent functions are contained in each cell type, it is clear in fact that the architectures in FIG. 3 and FIG. 9 are equivalent. The equivalence is made clear in FIG. 11 by drawing schematically the co-existing LUTs within the cell and comparing them to the repeated crossover structures in FIG. 3.

The present invention leads to a simpler building block approach for a molecular field programmable gate array, since 3LUTs can be replace with 2LUTs. Since kLUTs require $2^k$ storage sites, a 3LUT requires twice as much storage as a 2LUT, and, therefore, the 2LUT is roughly half the complexity of a 3LUT. As a building block cell structure in a repetitive array, it is a simpler building block.

What is claimed is:

1. A field programmable gate array (FPGA) having a 2-input Boolean look-up-table-based (2LUT-based) architecture comprising:

a. one or more arrays (tiles), each comprised of a plurality of LUTs arranged in a directed, repeatable x-column, y-row grid propagating in the positive y direction, with each LUT having only nearest neighbor connections to other LUTs and not any other bridging structures except at the boundaries, the definition of each LUT behavior in a tile being allowed to be distinct and individually programmable for a particular logic function;

b. each of said tiles having no specialized routing structures, since logic functions can imitate wiring from any LUT input to an output, allowing the LUTs to emulate both logic and (virtual) wiring; and c. periodic, alternating neighborhood templates in both horizontal and vertical directions for all LUTs in a particular tile.

2. A field programmable gate array (FPGA) having a 2-input Boolean look-up-table-based (2LUT-based) architecture comprising one or more arrays (tiles), each comprised of a plurality of cells arranged in a half-neighborhood cellular automata structure with each cell being identical and having identical connection geometries and further, having two independent 2LUTs within each cell with each 2LUT supplying a separate output.

* * * * *